(12) United States Patent
Li et al.

(10) Patent No.: US 9,379,054 B2
(45) Date of Patent: Jun. 28, 2016

(54) CHIP ON FILM AND DISPLAY APPARATUS

(71) Applicant: BOE Technology Group Co., Ltd., Beijing (CN)

(72) Inventors: Shou Li, Beijing (CN); Hong Wang, Beijing (CN); Jung Chul Gyu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/518,066

(22) Filed: Oct. 20, 2014

(65) Prior Publication Data

US 2015/0348896 A1 Dec. 3, 2015

(30) Foreign Application Priority Data

May 29, 2014 (CN) .......................... 2014 1 0235672

(51) Int. Cl.
*H01L 23/52* (2006.01)
*H01L 23/498* (2006.01)
*H01L 23/00* (2006.01)

(52) U.S. Cl.
CPC ...... *H01L 23/49838* (2013.01); *H01L 23/4985* (2013.01); *H01L 23/49811* (2013.01); *H01L 24/32* (2013.01); *H01L 2224/32227* (2013.01); *H01L 2924/20641* (2013.01); *H01L 2924/20642* (2013.01)

(58) Field of Classification Search
CPC ........... H01L 2924/20642; H01L 2924/20641; H01L 2224/32227
USPC ........................................................ 257/773
See application file for complete search history.

(56) References Cited

U.S. PATENT DOCUMENTS

| 6,251,517 | B1* | 6/2001 | Sashihara | .................. C09J 4/06 428/355 AC |
| 2003/0137034 | A1* | 7/2003 | Kobayashi | .......... H01L 23/4985 257/666 |
| 2010/0314773 | A1* | 12/2010 | Kobayashi | .............. H01L 21/50 257/773 |
| 2014/0027295 | A1* | 1/2014 | Chiao | .................. G01N 27/403 205/122 |

FOREIGN PATENT DOCUMENTS

| CN | 203312282 | * 11/2013 | .............. H01L 23/48 |
| CN | 203312282 U | 11/2013 | |

* cited by examiner

*Primary Examiner* — Tuan Nguyen
(74) *Attorney, Agent, or Firm* — Westman, Champlin & Koehler, P.A.

(57) ABSTRACT

The present disclosure of the present invention provides a chip on film and a display apparatus. The chip on film comprises a substrate having an input end lead and an output end lead, a region where the input end lead is located and a region where the output end lead is located are defined as a binding region, wherein the maximum thickness of the binding region is larger than the maximum thickness of other parts of the substrate than the binding region.

8 Claims, 4 Drawing Sheets

CHIP ON FILM AND DISPLAY APPARATUS

CROSS-REFERENCE TO RELATED APPLICATION

This application claims the benefit of Chinese Patent Application No. 201410235672.0 filed on May 29, 2014 in the State Intellectual Property Office of China, the whole disclosure of which is incorporated herein by reference.

BACKGROUND OF THE INVENTION

1. Field of the Invention

The present disclosure relates to a technical field of display, more particularly, to a chip on film and a display apparatus.

2. Description of the Related Art

With the development of the electronic and communication industry, demand for the flat panel display devices such as a light emitting diode (LED) and an organic light emitting diode (OLED), a plasma display panel (PDP) and a liquid crystal display (LCD) is increasing. The flat panel display devices have the development trend, for example, to become light, thin, short, and small-sized. The package techniques which have characteristics of high density, small volume, high mounting freedom degree or the like, are needed to meet the above requirements. Therefore, a chip on film (COF) package technique is developed.

The COF package technique is to fix a driver circuit onto a flexible circuit board, to use the flexible circuit board as a carrier for the package chip, and to combine the chip with the circuit of the flexible circuit board. As shown in FIG. 1, the existing COF arrangement includes a substrate 101, a driver circuit 102 fixed on the substrate 101, and an input end lead 103 and an output end lead 104 leaded out from the driver circuit 102. The input end lead 103 is electrically connected to a printed circuit board (PCB) with an anisotropic conductive film (ACF) by means of a pressing-jointing process. The output end lead 104 is electrically connected to pins on a glass substrate within the flat panel display with ACF by means of a pressing-jointing process, so that the PCB can transmit the driving signals to the respective signal lines within the flat display panel.

In the COF arrangement as described above, especially in the COF arrangement having a large bandwidth, the input end lead 103 or the output end lead 104 has a lager width in a direction as indicated by an arrow in FIG. 1. In this way, the surface of the input end lead 103 or the output end lead 104 tends to become uneven. In particular, after being attached with the ACF, the problem that the surface of the input end lead 103 or the output end lead 104 is bent, becomes more noticeable. As a result, generation of bubbles, docking offset or the like are created, after pressing the input end lead with the PCB or pressing the output end lead with the pins of the glass substrate within the display panel with ACF. Therefore, they severely adverse the yield of the flat panel display devices.

Therefore, it is an urgent technical problem to be solved by the skilled person how to avoid defects of the display devices caused by unevenness of the surface of the input end lead or the output end lead.

SUMMARY OF THE INVENTION

In view of the above, the embodiment of the present invention provides a chip on film and a display apparatus, so as to at least partly or entirely avoid defects of the display devices caused by unevenness of the surface of the input end lead or the output end lead.

In one aspect of the present invention, a chip on film is provided, which comprises a substrate having an input end lead and an output end lead, a region where the input end lead is located and a region where the output end lead is located are defined as a binding region, wherein the maximum thickness of the binding region is larger than the maximum thickness of other parts the substrate than the binding region.

In another aspect of the present invention, a display apparatus is provided, which comprises a chip on film as described above.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
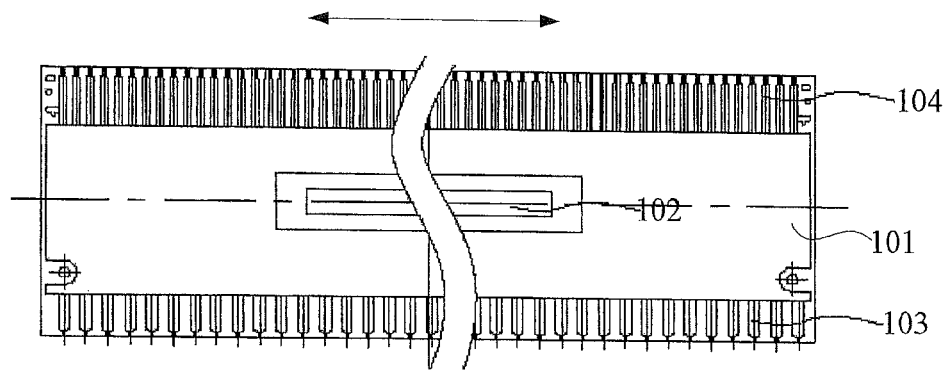
FIG. 1 is a schematic view of a structure of the existing chip on film arrangement.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A chip on film and a display apparatus in accordance with embodiments of the present invention are described in detail in conjunction with the accompanying figures.

In accordance with a first embodiment of the present invention, a chip on film is provided, as shown in FIGS. 2a-2e. It includes a substrate 3 having an input end lead 1 and an output end lead 2; wherein a region 4 where the input end lead 1 is located and a region 5 where the output end lead 2 is located are defined as a binding region 6.

Specifically, the maximum thickness of the binding region 6 is larger than the maximum thickness of other parts of the substrate 3 than the binding region 6. In view of this, it is possible to increase the strength of the input end lead 1 and the output end lead 2, so that the surface(s) of the input end lead 1 and/or the output end lead 2 has (have) a good flatness. When electrically connecting the input end lead 1 with the PCB and/or electrically connecting the output end lead 2 with the pins of the glass substrate in the display panel with the ACF by means of the pressing jointing process, it can prevent generating bubbles, producing the docking deviations or the like, so as to ensure the yield of the display devices.

FIGS. 2a-2e are respectively side views of the chip on film arrangements of various examples in the first embodiment of the present invention.

Figure 2A:
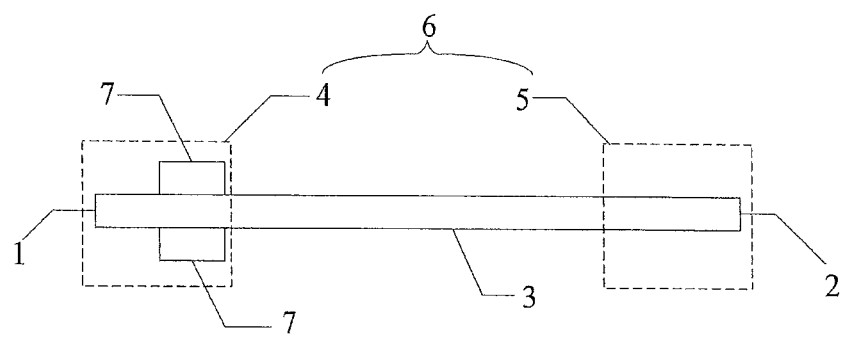
FIGS. 2a-2e are respectively schematic views of structures of the chip on film arrangements in accordance with a first embodiment of the present invention.

In one example, as shown in FIG. 2a, the maximum thickness of the binding region 6 is that of the region 4 where the input end lead 1 is located. That is, only the maximum thickness of the region 4 where the input end region 1 is located is larger than the maximum thickness of other parts of the substrate 3 than the binding region 6.

Figure 2B:
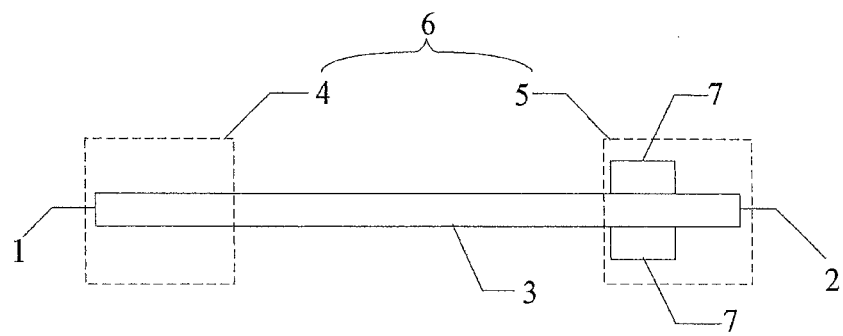

In another example, as shown in FIG. 2b, the maximum thickness of the binding region 6 is that of the region 5 where the output end lead 2 is located. That is, only the maximum thickness of the region 5 where the output end region 2 is located is larger than the maximum thickness of other parts of the substrate 3 than the binding region 6.

Figure 2C:
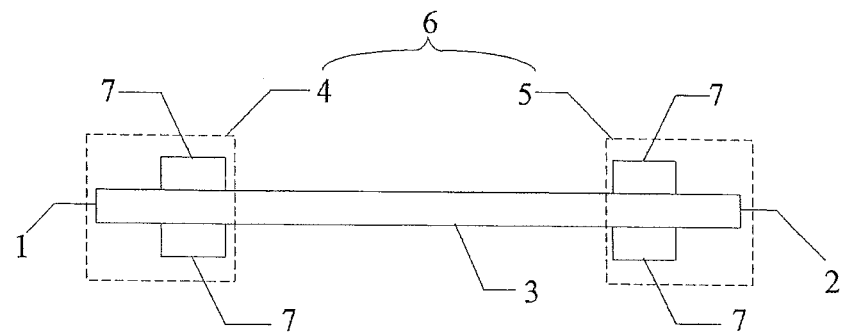

In another example, as shown in FIG. 2c, the region 4 where the input end lead 1 is located and the region 5 where the output end lead 2 is located, have the same maximum thickness. Both of them are larger than the maximum thickness of other parts of the substrate 3 than the binding region 6.

In practice, in the chip on film arrangement in accordance with the first embodiment of the present invention, the technical solution that the maximum thickness of the binding region 6 is larger than the maximum thickness of other parts of the substrate 3 than the binding region 6 can be embodied as follows:

as shown in FIGS. 2a-2e, the binding region 6 has an attachment film 7 for covering the input end lead 1 and exposing connecting terminals of the input end lead 1; and/or, the binding region 6 has an attachment film 7 for covering the output end lead 2 and exposing connecting terminals of the output end lead 2.

The exposed connecting terminals of the input end lead 1 can be electrically connected to the PCB with the ACF by means of the pressing jointing process, and the exposed connecting terminals of the output end lead 2 can be electrically connected to the pins of the glass substrate in the display panel with the ACF by means of the pressing-jointing process. In this way, the addition of the attachment film 7 into the region 4 where the input end lead 1 is located and the region 5 where the output end lead 2 is located can increase the thickness of the regions 4 and 5. This increases the strength of the input end lead 1 and the output end lead 2, and further avoids the defects of the display devices caused by the unevenness of the surfaces of the input end lead 1 and the output end lead 2.

Specifically, as shown in FIG. 2a, in the binding region 6, only the region 4 where the input end lead 1 is located is provided with the attachment film 7, which is used to cover the input end lead 1 and expose the connecting terminals of the input end lead 1. Alternatively, as shown in FIG. 2b, in the binding region 6, only the region 5 where the output end lead 2 is located is provided with the attachment film 7, which is used to cover the output end lead 2 and expose the connecting terminals of the output end lead 2. Of course, alternatively, as shown in FIG. 2c, the region 4 where the input end lead 1 is located and the region 5 where the output end lead 2 is located both are provided with the attachment films 7, which are used to cover the input and output end leads 1 and 2, and expose the connecting terminals of the input and output end leads 1 and 2, respectively.

Figure 3:
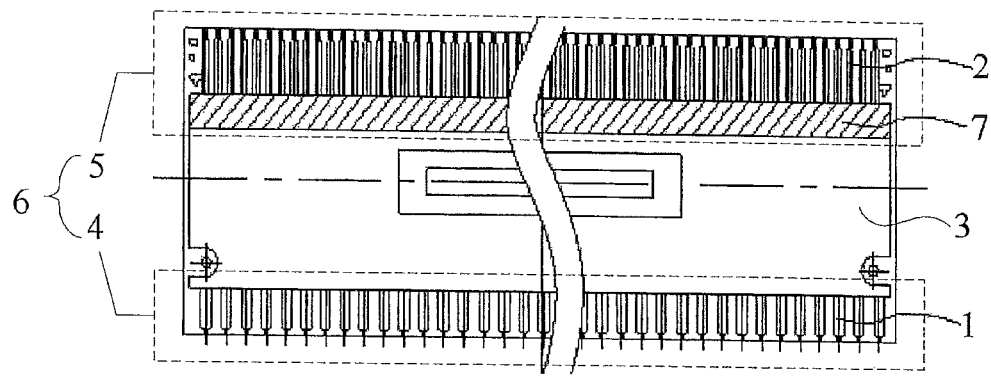
FIG. 3 is a top view of the arrangement shown in FIG. 2b.

The chip on film arrangement as shown in FIG. 2b is taken as one example, and FIG. 3 shows the corresponding top view. It can be clearly seen from FIG. 3 that the attachment film 7 covers the output end lead 2 and exposes the connecting terminals of the output end lead 2.

As shown in FIG. 2c, when in the binding region 6, the region 4 where the input end lead 1 is located and the region 5 wherein the output end lead 2 is located both are provided with the attachment films 7, the attachment film 7 in the region 4 has the same thickness as that in the region 5. In other words, the input end lead 1 has the strength enhanced by the same magnitude as the strength of the output end lead 2. Alternatively, the attachment film 7 of the region 4 may have a different thickness from that of the region 5, that is, the input end lead 1 has the strength enhanced by a different magnitude from the strength of the output end lead 2. In practice, it is possible to adjust the thickness of the attachment films 7 in the region 4 where the input end lead 1 is located and the region 5 where the output end lead 2 is located as required actually. Furthermore, it is possible to adjust the enhancing magnitude of the strength of the input end lead 1 and the output end lead 2.

Figure 2D:
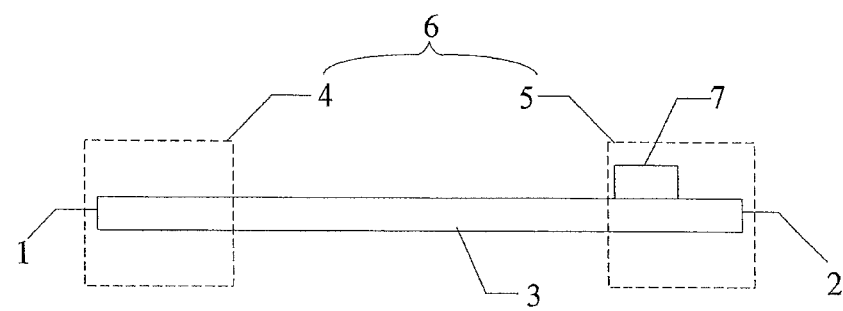
Figure 2E:
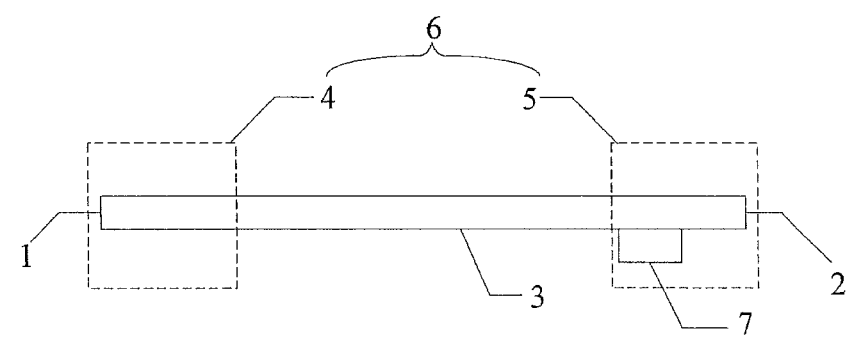

In one specific embodiment, within the chip on film in accordance with the first embodiment of the present invention, the attachment film 7 can be located on an upper surface and/or a lower surface of the substrate 3. Particularly, in the following explanation, only the attachment film 7 in the region 5 where the output end lead 2 is located is taken as one example. As shown in FIG. 2b, both the upper surface and the lower surface of the substrate 3 are provided with the attachment films 7, which cover the output end lead 2 and expose the connecting terminals of the output end lead 2. Moreover, the two attachment films 7 respectively disposed on the upper surface and the lower surface of the substrate 3 can have the same thickness or different thicknesses. Alternatively, as shown in FIG. 2d, only the upper surface of the substrate 3 is provided with the attachment film 7, which covers the output end lead 2 and exposes the connecting terminals of the output end lead 2. Alternatively, as shown in FIG. 2e, only the lower surface of the substrate 3 is provided with the attachment film 7, which covers the output end lead 2 and exposes the connecting terminals of the output end lead 2.

It should be noted that when the regions 4 and 5 both are provided with the attachment films 7, the attachment films 7 can optionally be disposed on the upper surface and/or the lower surface of the substrate 3, so as to cover the input end lead 1 and expose the connecting terminals of the input end lead 1, and/or so as to cover the output end lead 2 and expose the connecting terminals of the output end lead 2. In addition, the attachment films 7 in this case can have the same thickness or different thicknesses.

In the specific example, in the chip on film provided by the embodiment of the present invention, the material of the attachment film 7 is typically a cellulose triacetate having a pressure-sensitive adhesive. In one alternative example, it can also be any other suitable materials having certain strength and attached to the input end lead 1 and the output end lead 2.

In the chip on film in accordance with the second embodiment of the present invention, the technical solution that the maximum thickness of the binding region 6 is larger than the maximum thickness other parts of the substrate 3 than the binding region 6, can also be embodied as follows:

the maximum thickness of a part of the substrate 3 in the region 4 where the input end lead 1 is located is larger than the maximum thickness of other parts of the substrate 3 than the binding region 6; and/or the maximum thickness of a part of the substrate 3 in the region 5 where the output end lead 2 is located is larger than the maximum thickness of other parts of the substrate 3 than the binding region 6. In this way, thickening the input end lead 1 and the output end lead 2 can increase the strength of the input end lead 1 and the output end lead 2. It may prevent the deficiency of the display devices caused by the uneven surfaces of the input end lead 1 and the output end lead 2.

Figure 4A:
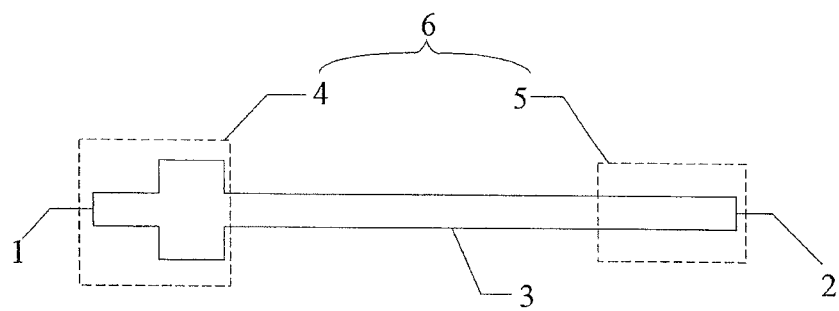
FIGS. 4a-4e are respectively schematic views of structures of the chip on film arrangements in accordance with a second embodiment of the present invention.
Figure 4B:
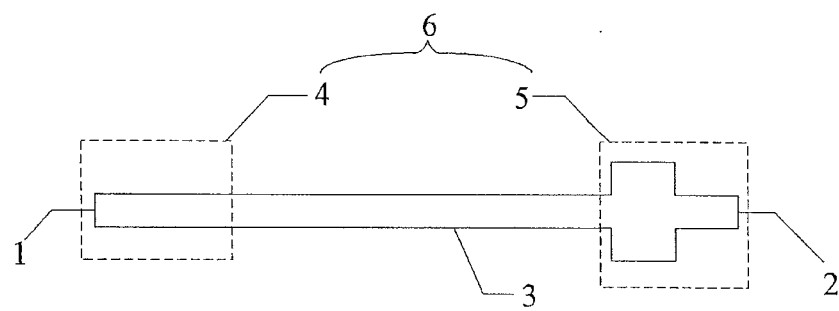
Figure 4C:
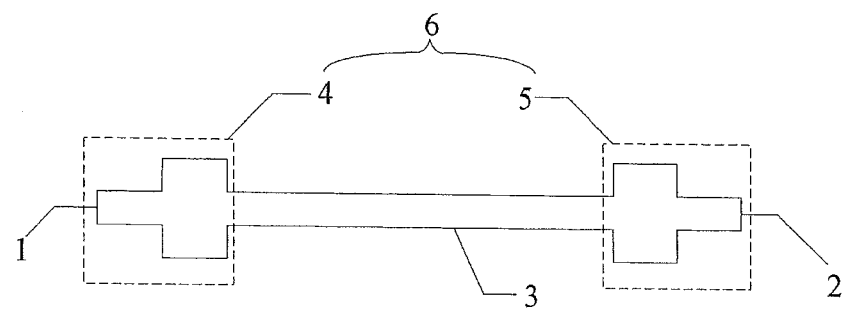

FIGS. 4a-4e are respectively side views of the chip on film arrangements in the second embodiment of the present invention. Specifically, as shown in FIG. 4a, only the maximum thickness of a part of the substrate 3 in the region 4 where the input end lead 1 is located is larger than that of other parts of the substrate 3 than the binding region 6. Alternatively, as shown in FIG. 4b, only the maximum thickness of a part of the substrate 3 in the region 5 where the output end lead 2 is located is larger than that of other parts of the substrate 3 than the binding region 6. In another alternation, as shown in FIG. 4c, both the maximum thickness of a part of the substrate 3 in the region 4 where the input end lead 1 is located, and the maximum thickness of a part of the substrate 3 in the region 5 where the output end lead 2 is located, are larger than the maximum thickness of other parts of the substrate 3 than the binding region 6.

As shown in FIG. 4c, when both the maximum thickness of the part of the substrate 3 in the region 4 where the input end lead 1 is located, and the maximum thickness of the part of the substrate 3 in the region 5 where the output end lead 2 is located, are larger than the maximum thickness of other parts of the substrate 3 than the binding region 6, the maximum thickness of the part of the substrate 3 in the region 4 and the maximum thickness of the part of the substrate 3 in the region 5 can be identical to each other, that is, the input end lead 1 has the same enhancing magnitude of strength as that of the output end lead 2. Alternatively, the maximum thickness of the part of the substrate 3 in the region 4 and the maximum thickness of the part of the substrate 3 in the region 5 can be different from each other, that is, the input end lead 1 has the different enhancing magnitudes of strength from that of the output end lead 2. In practice, it is possible to thicken the input end lead 1 and the output end lead 2 as required actually. Furthermore, it is possible to adjust the enhancing magnitudes of the strength of the input end lead 1 and the output end lead 2.

Figure 4D:
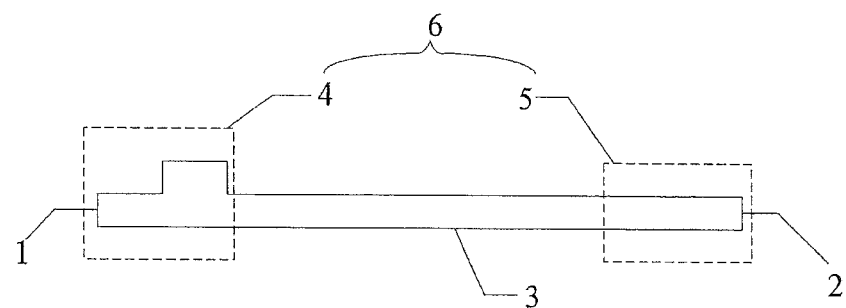
Figure 4E:
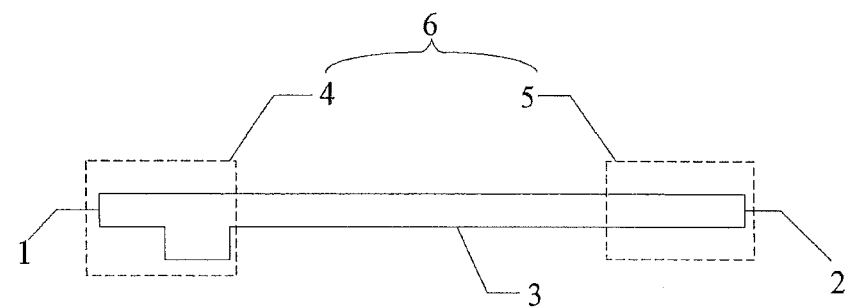

In a specific embodiment, within the chip on film arrangement in the present invention, when the strength of the input end lead 1 is increased by thickening the input end lead 1, on the upper surface and/or the lower surface of the substrate 3, the part of the substrate 3 in the region 4 where the input end lead 1 is located projects outside other parts of the substrate 3 than the binding region 6. Specifically, as shown in FIG. 4a, on the upper surface and/or the lower surface of the substrate 3, the part of the substrate 3 in the region 4 where the input end lead 1 is located projects outside other parts of the substrate 3 than the binding region 6, and the projections of the substrates 3 from the upper surface and the lower surface can has the same thickness or different thicknesses. Alternatively, as shown in FIG. 4d, only on the upper surface of the substrate 3, the part of the substrate 3 in the region 4 where the input end lead 1 is located projects outside other parts of the substrate 3 than the binding region 6. Also, in another alternation, as shown in FIG. 4e, only on the lower surface of the substrate 3, the part of the substrate 3 in the region 4 where the input end lead 1 is located projects outside other parts of the substrate 3 than the binding region 6. Although the above embodiments are explained with reference to the case that the input end lead 1 is thickened, the output end lead 2 can also be thickened in a similar way.

In practice, in the chip on film arrangements in accordance with the second embodiment of the present invention, when the strength of the output end lead 2 is increased by thickening the output end lead 2, on the upper surface and/or the lower surface of the substrate 3, the part of the substrate 3 in the region 5 where the output end lead 2 is located projects outside other parts of the substrate 3 than the binding region 6. The part of substrate 3 in the region 5 where the output end lead 2 is located can project outside other parts of the substrate 3 than the binding region 6, in the similar manner to the projection in the region 4 where the input end lead 1 is located, as described above. Therefore, the repeated description is omitted herein for sake of conciseness.

It should be noted that when the strength of the input end lead 1 and the output end lead 2 is increased at the same time, by thickening both the input end lead 1 and the output end lead 2, on the upper surface and/or the lower surface of the substrate 3, the part of the substrate 3 in the region 4 where the input end lead 1 is located may project outside other parts of the substrate 3 than the binding region 6, and/or the part of substrate 3 in the region 5 where the output end lead 2 is located may project outside other parts of the substrate 3 than the binding region 6. Furthermore, the projections from the substrate 3 can have the same thickness or different thicknesses.

In one specific example, in the chip on film in accordance with the embodiment of the present invention, the difference between the maximum thickness of the binding region 6 and the maximum thickness of the substrate 3 than the binding region 6 is controlled within a range of 0.1-0.2 mm.

In addition, the attachment film 7 or the projected substrate 3 in the binding region 6 typically has a width of 5 mm. Of course, this can be adjusted as required actually.

Based on the same inventive concept, the embodiment of the present invention provides a display apparatus, including the chip on film as described above. This display apparatus can include a product or a component having the display function, such as a mobile phone, a flat panel computer, a TV, a display, a notebook computer, a digital frame, a navigator, or the like. The implementation of the display apparatus can be referred to that of the chip on film as described above, and the repeated description is omitted herein for sake of conciseness.

In the chip on film of the present invention, because the maximum thickness of the binding region is larger than the maximum thickness of other parts of the substrate than the binding region, the strength of the input end lead and the output end lead can be increased, so that the surfaces of the input end lead and the output end lead can have a good flatness. When the input end lead is electrically connected to the PCB, and the output end lead is electrically connected to the pins of the glass substrate within the display panel, respectively by means of the pressing jointing process with the ACF, it is possible to avoid generating the bubbles and producing the docking deviations and so on. Therefore, it can ensure the yield of the display devices.

Although several exemplary embodiments have been shown and described, the present invention is not limited to those and it would be appreciated by those skilled in the art that various changes or modifications may be made in these embodiments without departing from the principles and spirit of the disclosure. These changes or modifications also fall within the scope of the present invention. The scope of the present invention is defined by the claims and their equivalents.

What is claimed is:

1. A chip on film, comprising a substrate having a plurality of input end leads and a plurality of output end leads, a region where the input end leads are located and a region where the output end lead is located are defined as a binding region, wherein the maximum thickness of the binding region is larger than the maximum thickness of other parts of the substrate than the binding region;
   wherein the binding region has a first attachment film therein configured to cover the input end leads and expose connecting terminals of the input end leads; and the binding region has a second attachment film therein configured to cover the output end leads and expose connecting terminals of the output end leads;
   the chip on film has a large bandwidth, the region where the input end leads are located and the region where the output end leads are located are arranged in a form of strip along a width direction of the substrate and positioned at two opposite sides of the substrate respectively; the input end leads are parallel with each other along the width direction of the substrate and spaced apart from each other within the region of the input end leads; and the output end leads are parallel with each other along the width direction of the substrate and spaced apart from each other within the region of the output end leads,
   wherein the connecting terminals of the input end leads have the same alignment direction within the region of the input end leads and extend toward an outside of the substrate, and the connecting terminals of the output end leads have the same alignment direction within the region of the output end leads and extend toward the outside of the substrate,
   wherein the first and/or second attachment film is/are made of a cellulose triacetate having a pressure-sensitive adhesive, a difference of the maximum thickness of the binding region from the maximum thickness of other parts of the substrate than the binding region is in a range of 0.1-0.2 mm.

2. The chip on film according to claim 1, wherein the first and/or second attachment film(s) is(are) located on an upper surface and/or a lower surface of the substrate.

3. The chip on film according to claim 1, wherein the maximum thickness of a part of the substrate in the region where the input end lead is located, is larger than the maximum thickness of the other parts of the substrate than the binding region; and/or
   the maximum thickness of a part of the substrate in the region where the output end lead is located, is larger than the maximum thickness of the other parts of the substrate than the binding region.

4. The chip on film according to claim 3, wherein on the upper surface and/or the lower surface of the substrate, the part of the substrate in the region where the input end lead is located projects outside the other parts of the substrate than the binding region.

5. The chip on film according to claim 3, wherein on the upper surface and/or the lower surface of the substrate, the part of the substrate in the region where the output end lead is located projects outside the other parts of the substrate than the binding region.

6. A display apparatus, comprising a chip on film according to claim 1.

7. The display apparatus according to claim 6, the first and/or second attachment film(s) is(are) located on an upper surface and/or a lower surface of the substrate.

8. The display apparatus according to claim 6, wherein the maximum thickness of a part of the substrate in the region where the input end lead is located, is larger than the maximum thickness of other parts of the substrate than the binding region, on the upper surface and/or the lower surface of the substrate, the part of the substrate in the region where the input end lead is located projects outside the other parts of the substrate than the binding region; and/or
   the maximum thickness of a part of the substrate in the region where the output end lead is located, is larger than the maximum thickness of other parts of the substrate than the binding region, on the upper surface and/or the lower surface of the substrate, the part of the substrate in the region where the output end lead is located projects outside the other parts of the substrate than the binding region.

* * * * *